United States Patent
Ban et al.

(10) Patent No.: US 11,276,343 B2
(45) Date of Patent: Mar. 15, 2022

(54) SUBSTRATE FOR LIGHT-EMITTING DIODE, BACKLIGHT MODULE AND DISPLAY DEVICE

(71) Applicant: BOE TECHNOLOGY GROUP CO., LTD., Beijing (CN)

(72) Inventors: Shengguang Ban, Beijing (CN); Zhanfeng Cao, Beijing (CN); Zhiwei Liang, Beijing (CN); Shi Shu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 162 days.

(21) Appl. No.: 16/406,542

(22) Filed: May 8, 2019

(65) Prior Publication Data
US 2020/0035147 A1  Jan. 30, 2020

(30) Foreign Application Priority Data
Jul. 25, 2018 (CN) .......................... 201810827930.2

(51) Int. Cl.
*G09G 3/32* (2016.01)
*H01L 33/08* (2010.01)
(Continued)

(52) U.S. Cl.
CPC ............ *G09G 3/32* (2013.01); *H01L 33/08* (2013.01); *H01L 33/24* (2013.01); *H01L 33/36* (2013.01);
(Continued)

(58) Field of Classification Search
CPC .......... G09G 3/32; G09G 3/342; H01L 33/36; H01L 33/24; H01L 33/60; H01L 33/62;
(Continued)

(56) References Cited

U.S. PATENT DOCUMENTS

2008/0099772 A1   5/2008  Shuy et al.
2008/0191620 A1*  8/2008  Moriyama .............. H01L 33/56
                                                          313/506
(Continued)

FOREIGN PATENT DOCUMENTS

CN   102867818 A   1/2013
CN   103515408 A   1/2014
(Continued)

OTHER PUBLICATIONS

First Chinese Office Action from Chinese Patent Application No. 201810827930.2 dated Oct. 30, 2020.

*Primary Examiner* — Jimmy H Nguyen
(74) *Attorney, Agent, or Firm* — Dilworth & Barrese, LLP.; Michael J. Musella, Esq.

(57) ABSTRACT

A substrate for light-emitting diode, a backlight module and a display device are disclosed. The substrate for light-emitting diode includes a plurality of light-emitting sub-regions, and each of the plurality of light-emitting sub-regions includes at least two anode electrode pads electrically connected through a first parallel-connection line, and at least two cathode electrode pads electrically connected through a second parallel-connection line. The at least two cathode electrode pads are disposed in one-to-one correspondence with the at least two anode electrode pads. At least one series-connection electrode pad group is further disposed between the anode electrode pad and the cathode electrode pad which are corresponding to each other; and each of the at least one series-connection electrode pad group includes two series electrode pads which are electrically connected through a series-connection line.

3 Claims, 9 Drawing Sheets

(51) Int. Cl.
  *H01L 33/24* (2010.01)
  *H01L 33/36* (2010.01)
  *H01L 33/60* (2010.01)
  H01L 33/12 (2010.01)
  G09G 3/34 (2006.01)
  H01L 33/62 (2010.01)

(52) U.S. Cl.
  CPC ............. *H01L 33/60* (2013.01); *G09G 3/342* (2013.01); *H01L 33/12* (2013.01); *H01L 33/62* (2013.01)

(58) Field of Classification Search
  CPC . H01L 33/08; H01L 33/12; H01L 2933/0066; H01L 25/0753
  USPC ............................................. 345/102, 76, 82
  See application file for complete search history.

(56) References Cited

U.S. PATENT DOCUMENTS

2013/0049563 A1* 2/2013 Kim ..................... H01L 33/486
                                                313/45
2013/0264594 A1* 10/2013 Huang ................. G02B 6/0068
                                                257/91
2019/0244983 A1    8/2019 Yuan et al.

FOREIGN PATENT DOCUMENTS

| CN | 107768382 A | 3/2016 |
| CN | 106206613 A | 12/2016 |

\* cited by examiner

```
┌─────────────────────────────────────────────────────────────────────────┐
│ defining a plurality of light-emitting sub-regions on a base substrate, │
│ and forming an anode wire and a cathode wire in each of the plurality   │─ S201
│ of light-emitting sub-regions                                           │
└─────────────────────────────────────────────────────────────────────────┘
                                      │
                                      ▼
┌─────────────────────────────────────────────────────────────────────────┐
│ in each of the plurality of light-emitting sub-regions, forming at least│
│ two anode electrode pads and a first parallel-connection line which are │
│ electrically connected with the anode wire, and forming at least two    │
│ cathode electrode pads and a second parallel-connection line which are  │─ S202
│ electrically connected with the cathode wire; the at least two anode    │
│ electrode pads being electrically connected through the first parallel- │
│ connection line, the at least two cathode electrode pads being          │
│ electrically connected through the second parallel-connection line, and │
│ the at least two cathode electrode pads being in one-to-one             │
│ correspondence with the at least two anode electrode pads               │
└─────────────────────────────────────────────────────────────────────────┘
                                      │
                                      ▼
┌─────────────────────────────────────────────────────────────────────────┐
│ forming at least one series-connection electrode pad group between anode│
│ electrode pad and cathode electrode pad which are corresponding to each │─ S203
│ other, and each of the at least one series-connection electrode pad     │
│ group comprising two series electrode pads electrically connected       │
│ through a series-connection line                                        │
└─────────────────────────────────────────────────────────────────────────┘
```

FIG. 16

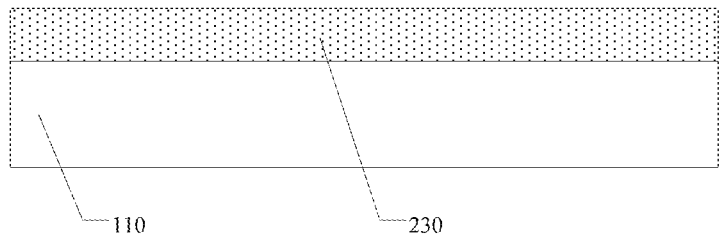

FIG. 17A

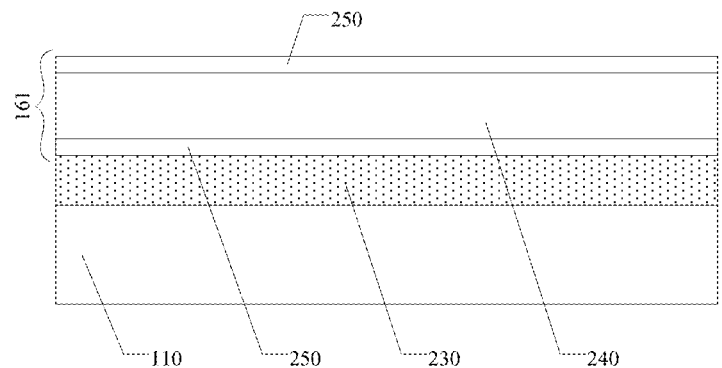

FIG. 17B

SUBSTRATE FOR LIGHT-EMITTING DIODE, BACKLIGHT MODULE AND DISPLAY DEVICE

The present application claims priority of China Patent application No. 201810827930.2 filed on Jul. 25, 2018, the content of which is incorporated in its entirety as portion of the present application by reference herein.

TECHNICAL FIELD

Embodiments of the present disclosure relate to a substrate for light-emitting diode, a backlight module and a display device.

BACKGROUND

With the continuous development of display technology, Thin Film Transistor-Liquid Crystal Display (TFT-LCD) has gradually become a main stream of displayers in the market. Generally, the TFT-LCD includes a backlight module, a polaroid, an array substrate (lower substrate), an opposed substrate (upper substrate) and a LC molecule layer which is filled in a cell assembled by the upper substrate and the lower substrate. The TFT-LCD rotates LC molecules in the LC molecule layer through an electric field between the array substrate (lower substrate) and the opposed substrate (upper substrate), and forms a LC light valve by cooperating with the polaroid. Because the LC per se doesn't emit light, a display function has to be achieved with the aid of a backlight module. Moreover, by cooperating with a color filter pattern formed on the array substrate or the opposed substrate, the TFT-LCD can further achieve a colorful display.

On the other hand, people have more and more requirements on a large-sized display device (large-sized television) having relatively higher contrast ratio and better display quality. However, the large-sized display device having relatively higher contrast ratio and better display quality requires for a backlight module having high performance to be cooperated therewith. Therefore, the backlight module having high performance also becomes a hotspot of current research.

SUMMARY

At least one embodiment of the present disclosure provides a substrate for light-emitting diode, including: a base substrate; and a plurality of light-emitting sub-regions disposed on the base substrate. Each of the light-emitting sub-regions includes at least two anode electrode pads electrically connected through a first parallel-connection line, and at least two cathode electrode pads electrically connected through a second parallel-connection line. The at least two cathode electrode pads are disposed in one-to-one correspondence with the at least two anode electrode pads. At least one series-connection electrode pad group is further disposed between the cathode electrode pad and the anode electrode pad which are corresponding to each other; each of the at least one series-connection electrode pad group includes two series electrode pads which are electrically connected through a series-connection line.

For example, in the substrate for light-emitting diode provided by an embodiment of the present disclosure, each of the plurality of light-emitting sub-regions further includes: an anode wire electrically connected with the anode electrode pad; and a cathode wire electrically connected with the cathode electrode pad.

For example, in the substrate for light-emitting diode provided by an embodiment of the present disclosure, each of the plurality of light-emitting sub-regions includes at least two light-emitting diode chip groups which are disposed in one-to-one correspondence with the at least two anode electrode pads; each of the at least two anode electrode pads is corresponding to at least one series electrode pad group; each of the at least two light-emitting diode chip groups includes at least two light-emitting diode chips; and in each of the at least two light-emitting diode chip groups, a corresponding one of the at least one series-connection electrode pad group is configured to connect the at least two light-emitting diode chips in series between the anode electrode pad and the cathode electrode pad which are corresponding to each other.

For example, in the substrate for light-emitting diode provided by an embodiment of the present disclosure, a plane where the base substrate is located includes a first direction and a second direction intersected with the first direction; the at least two anode electrode pads are arranged along the second direction; the at least two cathode electrode pads are arranged along the second direction; and the anode electrode pad and the cathode electrode pad corresponding to each other are arranged along the first direction.

For example, in the substrate for light-emitting diode provided by an embodiment of the present disclosure, each of the plurality of light-emitting sub-regions includes at least two light-emitting diode chip groups which are disposed in one-to-one correspondence with the at least two anode electrode pads; each of the at least two anode electrode pads is corresponding to at least one series electrode pad group; each of the at least two light-emitting diode chip groups includes at least two light-emitting diode chips; in each of the at least two light-emitting diode chip groups, the at least two light-emitting diode chips are arranged along the first direction, and each of the at least two light-emitting diode chips includes an anode and a cathode; an anode of a first light-emitting diode chip of the at least two light-emitting diode chips arranged along the first direction is connected with a corresponding anode electrode pad, and a cathode of a last light-emitting diode chip of the at least two light-emitting diode chips arranged along the first direction is connected with a corresponding cathode electrode pad; a sum of a number of anode and a number of cathode of the at least two light-emitting diode chips is equal to a sum of a number of the corresponding anode electrode pad, a number of series electrode pad, and a number of the corresponding cathode electrode pad which are corresponding to the at least two light-emitting diode chips; and the anodes and the cathodes of the at least two light-emitting diode chips are alternately disposed on the anode electrode pad, the series electrode pads and the cathode electrode pad which are corresponding to the at least two light-emitting diode chips.

For example, in the substrate for light-emitting diode provided by an embodiment of the present disclosure, the plurality of light-emitting sub-regions are disposed on the base substrate in an array along the first direction and the second direction; anode wires of different light-emitting sub-regions are different from each other; and M light-emitting sub-regions adjacent in the second direction share a same cathode wire, M is greater than or equal to 2.

For example, the substrate for light-emitting diode provided by an embodiment of the present disclosure further includes a first insulting layer disposed on a side of the anode wire and of the cathode wire away from the base substrate; the at least two anode electrode pads, the at least two cathode electrode pads, the series electrode pads, the first parallel line, the second parallel line, and the series line are disposed in a same layer and located on a side of the first insulating layer away from the base substrate, the first insulating layer includes a first via hole and a second via hole, the anode wire is electrically connected with the anode electrode pad or the first parallel-connection line through the first via hole, and the cathode wire is electrically connected with the cathode electrode pad or the second parallel-connection line through the second via hole.

For example, the substrate for light-emitting diode provided by an embodiment of the present disclosure further includes a reflecting layer located within a region delimited by the first parallel-connection line, the second parallel-connection line and the series-connection line, the reflecting layer is disposed in a same layer with the anode electrode pad, the cathode electrode pad, the first parallel-connection line, the second parallel-connection line and the series-connection line, and is made of a same material with the anode electrode pad, the cathode electrode pad, the first parallel-connection line, the second parallel-connection line and the series-connection line; and a material of the reflecting layer includes ITO/Ag/ITO.

For example, in the substrate for light-emitting diode provided by an embodiment of the present disclosure, a thickness of at least one of the anode wire and the cathode wire is greater than or equal to a thickness of at least one of the first parallel-connection line and the second parallel-connection line.

For example, in the substrate for light-emitting diode provided by an embodiment of the present disclosure, a material of at least one of the anode wire and the cathode wire includes copper (Cu).

For example, in the substrate for light-emitting diode provided by an embodiment of the present disclosure, at least one of the anode wire and the cathode wire includes: at least two metallic sub-layers stacked along a direction perpendicular to the base substrate; and an interlayered insulating layer disposed between two adjacent ones of the at least two metallic sub-layers; the interlayered insulating layer includes a third via hole, and the metallic sub-layers located at two sides of the interlayered insulating layer are electrically connected through the third via hole.

For example, in the substrate for light-emitting diode provided by an embodiment of the present disclosure, at least one of the anode wire and the cathode wire includes at least two interlayered insulating layers; and orthographic projections of third via holes of the at least two interlayered insulating layers on the base substrate are arranged in a staggered manner.

For example, in the substrate for light-emitting diode provided by an embodiment of the present disclosure, a material of at least one of the anode wire and the cathode wire includes copper (Cu), the metallic sub-layer is a Cu sub-layer, a thickness of the Cu sub-layers is smaller than 3 µm, and a thickness of the interlayered insulating layer is in the range of 1-3 µm.

For example, in the substrate for light-emitting diode provided by an embodiment of the present disclosure, at least one of the anode wire and the cathode wire includes: a stress buffering layer; and a Cu layer disposed on a side of the stress buffering layer away from the base substrate; a material of the stress buffering layer includes a material generating a compressive stress.

For example, in the substrate for light-emitting diode provided by an embodiment of the present disclosure, the stress buffering layer includes a recess, the recess is concaved from a surface of the stress buffering layer away from the base substrate towards the base substrate, and the Cu layer includes a filling portion filled within the recess.

For example, in the substrate for light-emitting diode provided by an embodiment of the present disclosure, a material of the stress buffering layer includes silicon nitride (SiNx).

For example, in the substrate for light-emitting diode provided by an embodiment of the present disclosure, at least one of the anode wire and the cathode wire includes: a Cu layer; and Mo—Nb alloy (MoNb) layers on both sides of the Cu layer.

At least one embodiment of the present disclosure provides a backlight module, including the substrate for light-emitting diode described in any of the embodiments above.

At least one embodiment of the present disclosure provides a display device, including a display panel and a backlight module; the backlight module includes the backlight module described in any of the embodiments above.

At least one embodiment of the present disclosure provides a manufacturing method of a substrate for light-emitting diode, including: defining a plurality of light-emitting sub-regions on a base substrate, and forming an anode wire and a cathode wire in each of the plurality of light-emitting sub-regions; in each of the plurality of light-emitting sub-regions, forming at least two anode electrode pads and a first parallel-connection line which are electrically connected with the anode wire, and forming at least two cathode electrode pads and a second parallel-connection line which are electrically connected with the cathode wire, the at least two anode electrode pads being electrically connected through the first parallel-connection line, the at least two cathode electrode pads being electrically connected through the second parallel-connection line, and the at least two cathode electrode pads being in one-to-one correspondence with the at least two anode electrode pads; and forming at least one series-connection electrode pad group between the anode electrode pad and the cathode electrode pad which are corresponding to each other, each of the at least one series-connection electrode pad group including two series electrode pads electrically connected through a series-connection line.

BRIEF DESCRIPTION OF THE DRAWINGS

Hereinafter, the drawings accompanying embodiments of the present disclosure are simply introduced in order to more clearly explain technical solution(s) of the embodiments of the present disclosure. Obviously, the described drawings below are merely related to some of the embodiments of the present disclosure without constituting any limitation thereto.

FIG. 16 is a flow chart illustrating a manufacturing method of a substrate for light-emitting diode provided by an embodiment of the present disclosure;

FIG. 17A-FIG. 17F are schematic diagrams illustrating various steps of a manufacturing method of a substrate for light-emitting diode provided by an embodiment of the present disclosure;

DETAILED DESCRIPTION

Figure 1:
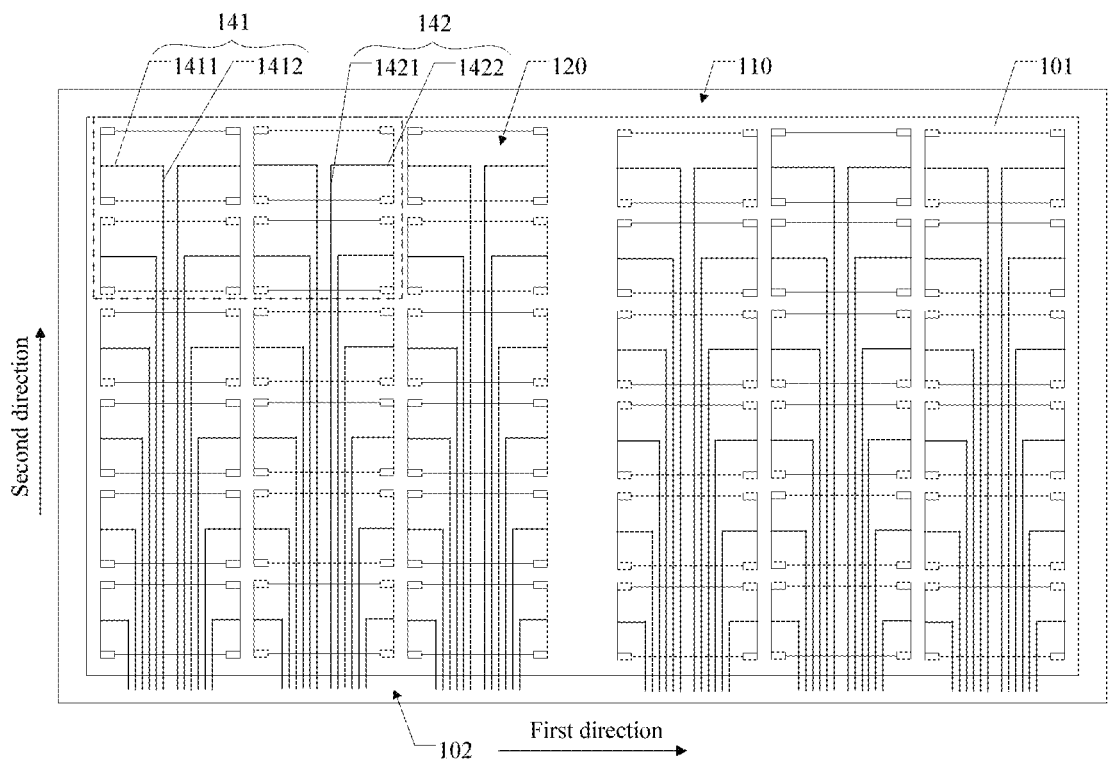
FIG. 1 is a plan view illustrating a substrate for light-emitting diode provided by an embodiment of the present disclosure.

In order to make objects, technical details and advantages of the embodiments of the disclosure apparent, technical solutions according to the embodiments of the present disclosure will be described clearly and completely as below in conjunction with the accompanying drawings of embodiments of the present disclosure. Apparently, the described embodiments are only a part of but not all of exemplary embodiments of the present disclosure. Based on the described embodiments of the present disclosure, various other embodiments can be obtained by those of ordinary skill in the art without creative labor and those embodiments shall fall into the protection scope of the present disclosure.

Unless otherwise defined, the technical terminology or scientific terminology used herein should have the same meaning as commonly understood by one of ordinary skill in the art to which this disclosure belongs. Likewise, terms like "first," "second," etc., which are used in the description and the claims of the present application for disclosure, are not intended to indicate any sequence, amount or importance, but distinguish various components. The phrases "connect", "connected", etc., are not intended to define a physical connection or mechanical connection, but may include an electrical connection, directly or indirectly.

At present, in a display process of a liquid crystal display device (e.g., television), a contrast ratio can be improved by dividing a backlight module of the liquid crystal display device into a plurality of light-emitting sub-regions and by individually controlling each of the light-emitting sub-regions. For example, upon an image displayed by the liquid crystal display device including a black area, a light-emitting sub-region of the backlight module corresponding to the black area may be completely turned off so that an absolute black can be achieved in the black area, thereby improving the contrast ratio of the liquid crystal display device. However, upon each of the light-emitting sub-regions of the backlight module being controlled individually, it usually needs to form a driving circuit on a PCB backboard, which may result in relatively higher costs and a relatively larger thickness. Furthermore, with an increase of a size of the liquid crystal display device, a current on the driving circuit as well as the number of wire in the driving circuit both are increased, which results in that a conventional wiring solution is difficult to satisfy requirements of a larger-sized backlight module.

Embodiments of the present disclosure provide a substrate for light-emitting diode, a backlight module and a display device. The substrate for light-emitting diode includes a base substrate and a plurality of light-emitting sub-regions disposed on the base substrate. Each of the light-emitting sub-regions includes: at least two anode electrode pads electrically connected through a first parallel-connection line; at least two cathode electrode pads electrically connected through a second parallel-connection line; an anode wire electrically connected to the anode electrode pad or the first parallel-connection line; and a cathode wire electrically connected to the cathode electrode pad or the second parallel-connection line. The at least two cathode electrode pads are disposed in one-to-one correspondence with the at least two anode electrode pads. Each of the light-emitting sub-regions further includes at least one series-connection electrode pad group disposed between the anode electrode pad and the cathode electrode pad which are corresponding to each other. Each of the at least one series-connection electrode pad group includes two series electrode pads which are electrically connected through a series-connection line. In this way, the substrate for light-emitting diode can provide a new wiring solution for light-emitting diode, which forms a driving circuit of the light-emitting diode on a base substrate like a glass substrate so as to decrease a thickness of the substrate for light-emitting diode and reduce manufacture costs. Moreover, by providing a plurality of light-emitting sub-regions on the substrate for light-emitting diode and by individually controlling each of the light-emitting sub-regions, a backlight module using such substrate for light-emitting diode can have larger size and higher contrast ratio, and also can possess more advantageous under HDR display.

Hereinafter, the substrate for light-emitting diode, the backlight module and the display device provided by embodiments of the present disclosure will be described in more details with reference to the drawings.

Figure 2A:
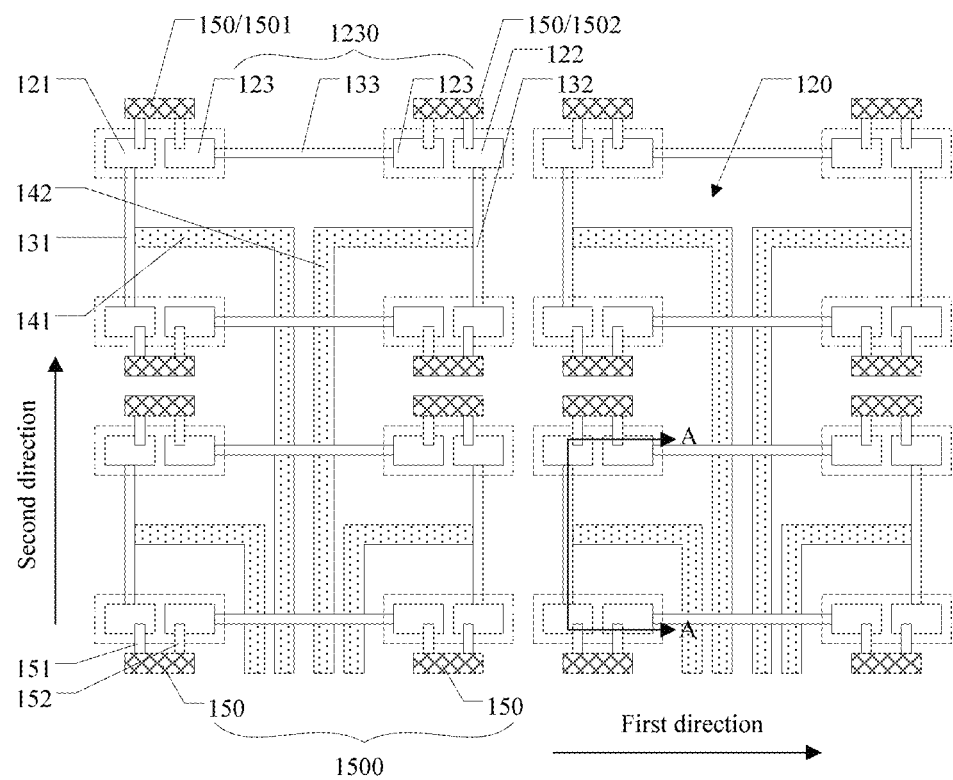
FIG. 2A is a partially enlarged view illustrating a portion of a substrate for light-emitting diode provided by an embodiment of the present disclosure corresponding to a dashed box of FIG. 1.

An embodiment of the present disclosure provides a substrate for light-emitting diode. FIG. 1 is a plan view illustrating a substrate for light-emitting diode provided by an embodiment of the present disclosure. FIG. 2A is a partially enlarged view illustrating a portion of a substrate for light-emitting diode provided by an embodiment of the present disclosure corresponding to a dashed box of FIG. 1. The substrate for light-emitting diode includes a base substrate 110 and a plurality of light-emitting sub-regions 120 disposed on the base substrate 110. As illustrated in FIG. 2A, each of the light-emitting sub-regions 120 includes: at least two anode electrode pads 121 electrically connected through a first parallel-connection line 131; at least two cathode electrode pads 122 electrically connected through a second parallel-connection line 132; an anode wire 141 electrically connected with the anode electrode pad 121 or the first parallel-connection line 131; and a cathode wire 142 electrically connected with the cathode electrode pad 122 or the second parallel-connection line 132. The above-mentioned at least two cathode electrode pads 122 and at least two anode electrode pads 121 are disposed in one-to-one correspondence; and a series-connection electrode pad group 1230 is further disposed between the anode electrode pad 121 and the cathode electrode pad 122 which are corresponding to each other. Each of the series-connection electrode pad group 1230 includes two series electrode pads 123 which are electrically connected through a series-connection line 133.

For example, in some examples, as illustrated in FIG. 1, a plane where the base substrate 110 is located includes a first direction and a second direction intersected with the first direction. FIG. 2A illustrates four light-emitting sub-regions 120. As illustrated in FIG. 2A, each of the light-emitting sub-regions 120 includes: at least two anode electrode pads 121 which are arranged along the second direction and are electrically connected through a first parallel-connection line 131; at least two cathode electrode pads 122 which are arranged along the second direction and are electrically connected through a second parallel-connection line 132; an anode wire 141 electrically connected with the anode electrode pad 121 or the first parallel-connection line 131; and a cathode wire 142 electrically connected with the cathode electrode pad 122 or the second parallel-connection line 132. That is to say, because there are at least two anode electrode pads 121 electrically connected through the first parallel-connection line 131, when the anode wire 141 is electrically connected with the anode electrode pad 121 or the first parallel-connection line 131, the anode wire 141 is electrically connected with each of the at least two anode electrode pads 121, and an electric potential of the anode wire 141 is as same as that on the at least two anode electrode pads 121; similarly, because there are at least two cathode electrode pads 122 electrically connected through the second parallel-connection line 132, when the cathode wire 142 is electrically connected with the cathode electrode pad 122 or the second parallel-connection line 132, the cathode wire 142 is electrically connected with each of the at least two cathode electrode pads 122, and an electric potential of the cathode wire 142 is as same as that on the at least two cathode electrode pads 122. Moreover, the above-mentioned at least two cathode electrode pads 122 are disposed in one-to-one correspondence with the at least two anode electrode pads 12; that is to say, the number of the cathode electrode pads 122 is as same as the number of the anode electrode pads 121, and each of the cathode electrode pads 122 is corresponding to one of the anode electrode pads 121. In such case, a series electrode pad 1230 is further disposed between the anode electrode pad 121 and the cathode electrode pad 122 which are corresponding to each other; and each of the series electrode pad 1230 includes two series electrode pads 123 which are electrically connected through a series-connection line 133. It should be explained that, the above expression of "arranged along the second direction" is not intended to define an arrangement absolutely along the second direction but may have a certain angular deviation, as long as it's an arrangement substantially along the second direction. Additionally, in FIG. 2A, a portion of the anode wire 141 or the cathode wire 142 that is intersected with the series-connection line 133 is not electrically connected with the series-connection line 133 but may be insulated therefrom by an insulating layer disposed there-between.

For example, in some examples, upon a plurality of series electrode pad groups 1230 being disposed between the anode electrode pad 121 and the cathode electrode pad 122 which are corresponding to each other, the plurality of series electrode pad groups 1230 may be arranged along the first direction.

In the substrate for light-emitting diode provided by the present embodiment, the anode electrode pad 121, the cathode electrode pad 122 and the series electrode pad 123 in the light-emitting sub-region 120 are configured to provide a plurality of light-emitting diode chips with a power supply and a drive. Each of the at least two anode pad electrode 121 electrically connected with the anode wire 141 can be connected with an anode of one light-emitting diode chip, so that at least two light-emitting diode chips connected to at least two anode electrode pads 121 can be connected "in parallel"; each of the at least two cathode electrode pads 122 electrically connected with the cathode wire 142 can be connected with a cathode of another light-emitting diode chip, so that at least two light-emitting diode chips connected to at least two cathode electrode pads 122 can be connected "in parallel"; at least one series-connection electrode pad group 1230 arranged along the first direction that is disposed between the anode electrode pad 121 and the cathode electrode pad 122 which are corresponding to each other can connect at least two light-emitting diode chips arranged along the first direction "in series". In this way, each of the light-emitting sub-regions 120 can constitute a "N-series N-parallel" (N is equal to or greater than 2) structure.

In order to clearly explain a connecting relationship between the anode electrode pad 121, the cathode electrode pad 122, the series electrode pad 123 and the light-emitting diode chip, FIG. 2A illustrates a plurality of light-emitting diode chips by way of example. Hereinafter, the light-emitting sub-region 120 located at an upper-left position of FIG. 2A will be described by way of examples. In the light-emitting sub-region 120, each of the two anode electrode pads 121 electrically connected with the anode wire 141 can be connected to an anode 151 of one light-emitting diode chip 150 (e.g., a first light-emitting diode chip 1501); each of the two cathode electrode pads 122 electrically connected with the cathode wire 142 can be connected to a cathode 152 of the other light-emitting diode chip 150 (e.g., a second light-emitting diode chip 1502); in the series-connection electrode pad group 1230 disposed between the anode electrode pad 121 and the cathode electrode pad 122 corresponding to each other, a series electrode pad 123 closer to the anode electrode pad 121 can be used as the cathode 152 of the first light-emitting diode chip 1501, and a series electrode pad 123 closer to the cathode electrode pad 122 can be used as the anode 151 of the second light-emitting diode chip 1502. In this way, the current can flow through the anode wire 141, the anode electrode pad 121, the anode 151 of the first light-emitting diode chip 1501, the cathode 152 of the first light-emitting diode chip 1501, the series electrode pad 123 closer to the anode electrode pad 121 in the series-connection electrode pad group 1230 disposed between the anode electrode pad 121 and the cathode electrode pad 122 corresponding to each other, the series-connection line 133, the series electrode pad 123 closer to the cathode electrode pad 122 in the series-connection electrode pad group 1230 disposed between the anode electrode pad 121 and the cathode electrode pad 122 corresponding to each other, the anode 151 of the second light-emitting diode chip 1502, the cathode 152 of the second light-emitting diode chip 1502, the cathode electrode pad 122 and the cathode wire 142, in sequence, so as to connect the first light-emitting diode chip 1501 and the second light-emitting diode chip 1502 in series between the anode electrode pad 121 and the cathode electrode pad 122 which are corresponding to each other. In such case, because two anode electrode pads 121 are electrically connected through a first parallel-connection line 131 and two cathode electrode pads 122 are electrically connected through a second parallel-connection line 132, the first parallel-connection line 131 and the second parallel-connection line 132 can connect two light-emitting diode chip groups (each including a first light-emitting diode chip 1501 and a second light-emitting diode chip 1502) corresponding to two anode electrode pads 121 and two cathode electrode pads 122, in parallel, so as to constitute a "2-series 2-parallel" structure. In such case, the light-emitting sub-region 120 located at an upper-left position of FIG. 2A can include and simultaneously drive four light-emitting diode chips 150. It should be explained that, the dashed boxes in FIG. 2A can indicate electrode pads (anode electrode pad, cathode electrode pad or series electrode pad) connected with the anode and the cathode of the same light-emitting diode.

The substrate for light-emitting diode provided by the present embodiment can provide a new wiring solution for light-emitting diode, which forms a driving circuit of the light-emitting diode on a base substrate so as to decrease a thickness of the substrate for light-emitting diode and reduce a manufacture cost. Moreover, by providing a plurality of light-emitting sub-regions with the above "N-series N-parallel" structure on the substrate for light-emitting diode, it can achieve driving a plurality of light-emitting diode chips in one light-emitting sub-region and independently controlling each of the light-emitting sub-regions. On one hand, the substrate for light-emitting diode can decrease the number of wire in the driving circuit of the light-emitting diode chip by driving a plurality of light-emitting diodes in one light-emitting sub-region; on the other hand, the light-emitting diode chip can increase a luminance difference between different light-emitting sub-regions by independently driving each of the light-emitting sub-regions through. In this way, a backlight module using such substrate for light-emitting diode can have larger size and higher contrast ratio.

For example, the base substrate above can be a glass substrate. Because a glass substrate may be thinner and lighter with respect to a PCB board, the thickness of the substrate for light-emitting diode as well as the manufacture cost can be reduced.

It should be noted that, for the above-mentioned "N-series N-parallel", N may be selected depending on dimension(s) of the substrate for light-emitting diode, parameter(s) of the light-emitting diode chip, material(s) of the wire and other factors. That is to say, the number of light-emitting diode chip in one light-emitting sub-region may be selected depending on the dimension(s) of the substrate for light-emitting diode, the parameter(s) of the light-emitting diode chip, the material(s) of the wire and other factors. For example, upon copper being selected to form the above-described anode wire and cathode wire, a substrate for light-emitting diode corresponding to a 65-inch liquid crystal display device can include 1536 light-emitting sub-regions; and each of the light-emitting sub-regions can be configured as a "3-series 4-parallel" structure. In such case, each of the light-emitting sub-regions has 12 light-emitting diode chips, and the substrate for light-emitting diode can have 18432 light-emitting diode chips in total.

For example, in some examples, as illustrated in FIG. 2A, the first direction is perpendicular to the second direction.

For example, in some examples, as illustrated in FIG. 2A, each of the light-emitting sub-regions includes at least two light-emitting diode chip groups 1500 which are disposed in one-to-one correspondence with at least two anode electrode pads 121; each of the anode electrode pads 121 corresponds to at least one series-connection electrode pad group 1230; each of the light-emitting diode chip groups 1500 includes at least two light-emitting diode chips 150; and in each of the light-emitting diode chip groups 1500, the at least two light-emitting diode chips 150 are connected in series between the anode electrode pad 121 and the cathode electrode pad 122 corresponding to each other, through the corresponding at least one series-connection electrode pad group 1230. For example, in some examples, as illustrated in FIG. 2A, the light-emitting sub-region 120 includes at least two light-emitting diode chip groups 1500 which are arranged along the second direction and are disposed in one-to-one correspondence with at least two anode electrode pads 121. Each of the groups of light-emitting chips 1500 includes at least two light-emitting diode chips 150. In each of the groups of light-emitting chips 1500, the at least two light-emitting diode chips 150 are arranged along the first direction, and each of the light-emitting diode chips 150 includes an anode 151 and a cathode 152. An anode of a first light-emitting diode chip 150 arranged along the first direction is connected with the anode electrode pad; a cathode of a last light-emitting diode chip 150 arranged along the first direction is connected with the cathode electrode pad; a sum of the number of anode and the number of cathode of the at least two light-emitting diode chips is equal to a sum of the number of anode electrode pad, the number of series electrode pad and the number of cathode electrode pad which are disposed corresponding to the at least two light-emitting diode chips; the anode and the cathode of the at least two light-emitting diode chips are alternately disposed on the anode electrode pad, the series electrode pad and the cathode electrode pad which are disposed corresponding to the at least two light-emitting diode chips.

For example, as illustrated in FIG. 2A, the light-emitting sub-region 120 includes at least two light-emitting diode chip groups 1500 which are arranged along the second direction and are disposed in one-to-one correspondence with at least two anode electrode pads 121 and at least two cathode electrode pads 122. That is to say, one group of light-emitting diode chips 1500 corresponds to one anode electrode pad 121 and one cathode electrode pad 122. Each of the light-emitting diode chip groups 1500 includes at least two light-emitting diode chips 150 which are arranged along the first direction; each of the light-emitting diode chips 150 includes an anode 151 and a cathode 152; a sum of the number of anode 150 and the number of cathode 151 of the at least two light-emitting diode chips 150 is equal to a sum of the number of the corresponding anode electrode pad 121 (e.g., one), the number of series electrode pad 123 and the number of the corresponding cathode electrode pad 122 (e.g., one) which are disposed corresponding to the at least two light-emitting diode chips 150. The anode 151 and the cathode 152 of the at least two light-emitting diode chips 150 arranged along the first direction are alternately disposed, and are electrically connected respectively with the anode electrode pad 121, the series electrode pad 123 and the cathode electrode pad 122 which are disposed corresponding to the at least two light-emitting diode chips 150. It should be explained that, in the case where the substrate for light-emitting diode provided by the present embodiment is not provided with a light-emitting diode, it may serve as a driving backboard of a light-emitting diode; and in the case where the substrate for light-emitting diode provided by the present embodiment is provided with a light-emitting diode, it may be applied to a backlight module or a display device.

For example, as illustrated in FIG. 2A, given that the light-emitting diode chip of the at least two light-emitting diode chips 150 arranged along the first direction closer to the anode electrode pad 121 is a first light-emitting diode chip 1501, and the light-emitting diode chip of the at least two light-emitting diode chips 150 arranged along the first direction closer to the cathode electrode pad 122 is a second light-emitting diode chip 1502, an arrangement manner of the anode 151 and the cathode 152 of the at least two light-emitting diode chips 150 arranged along the first direction can include: along the first direction, the anode 151 of the first light-emitting diode chip 1501, the cathode 152 of the first light-emitting diode chip 1501, the anode 151 of the second light-emitting diode chip 1502 and the cathode 152 of the second light-emitting diode chip 1502 are disposed in sequence. In such case, an arrangement manner of the anode electrode pad 121, the series electrode pad 123 and the cathode electrode pad 122 disposed corresponding to the at least two light-emitting diode chips can include: along the first direction, the anode electrode 121, the series electrode pad 123, the series electrode pad 123 and the cathode electrode 122 are disposed in sequence. The anode 151 of the first light-emitting diode chip 1501, the cathode 152 of the first light-emitting diode chip 1501, the anode 151 of the second light-emitting diode chip 1502 and the cathode 152 of the second light-emitting diode chip 1502 that are arranged in sequence along the first direction are electrically connected, respectively, with the anode electrode pad 121, the series electrode pad 123, the series electrode pad 123 and the cathode electrode pad 122 which are arranged in sequence along the first direction.

For example, in some examples, as illustrated in FIG. 2A, a connection line between the anode electrode 121 and the cathode electrode pad 122 disposed corresponding to each other is parallel to the first direction.

For example, in some examples, as illustrated in FIG. 1, the substrate for light-emitting diode includes: a light-emitting region 101 and a periphery region 102 located around the light-emitting region 101; an anode wire 141 includes a first portion 1411 extending along a first direction and a second portion 1412 which is connected to the first portion 1411 and extending along a second direction; the second portion 1412 extends from the light-emitting region 101 to the periphery region 102. Similarly, a cathode wire 142 includes a third portion 1421 extending along the first direction and a fourth portion 1422 which is connected to the first portion 1421 and extending along the second direction; the fourth portion 1422 extends from the light-emitting region 101 to the periphery region 102.

Figure 2B:
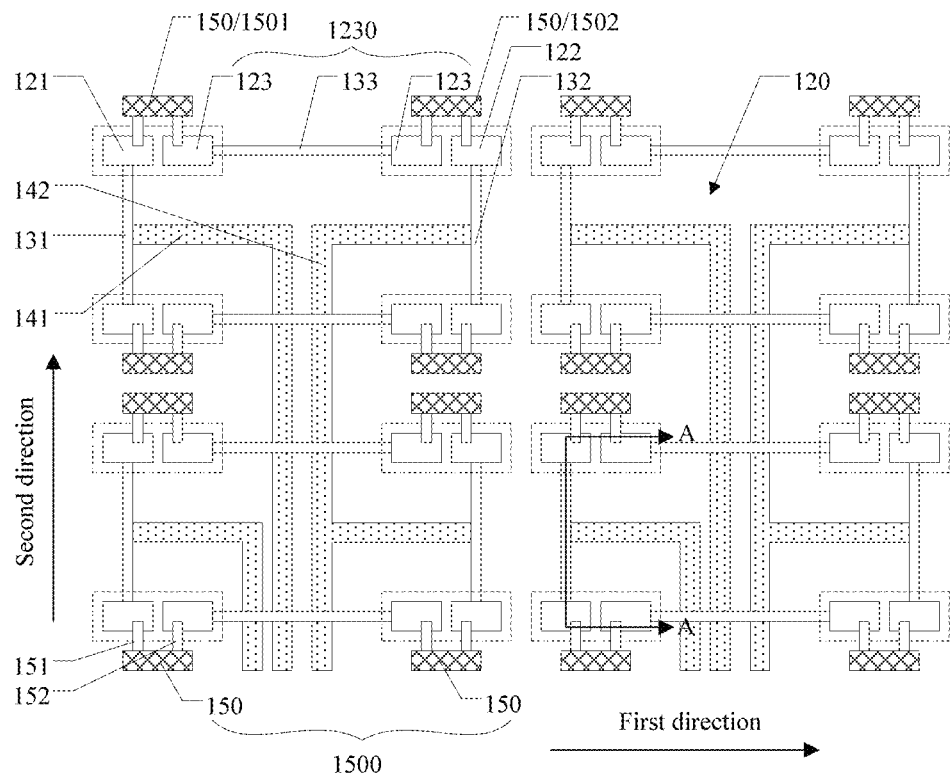
FIG. 2B is a partially enlarged view illustrating a portion of another substrate for light-emitting diode provided by an embodiment of the present disclosure corresponding to a dashed box of FIG. 1.

For example, in some examples, as illustrated in FIG. 1 and FIG. 2A, a plurality of light-emitting sub-regions 120 is disposed on a base substrate 110, the light-emitting sub-regions 120 are arranged in an array along a first direction and a second direction, and different light-emitting sub-regions 120 have different anode wires 141; as a result, each of the light-emitting sub-regions 120 can be individually controlled by applying the anode wire 141 with a different voltage or current. For example, as illustrated in FIG. 1 and FIG. 2A, different light-emitting sub-regions 120 have different cathode wires 142. However, the embodiments of the present disclosure include such case but are not limited thereto. FIG. 2B is a partially enlarged view illustrating a portion of another substrate for light-emitting diode provided by an embodiment of the present disclosure corresponding to a dashed box of FIG. 1. As illustrated in FIG. 2B, because the cathode wire 142 is only used for exporting the current of the light-emitting sub-region 120, M light-emitting sub-regions 120 that are adjacent along the second direction share a same cathode wire 142, with M being greater than or equal to 2, so as to reduce the number of the cathode wire 142.

Figure 3:
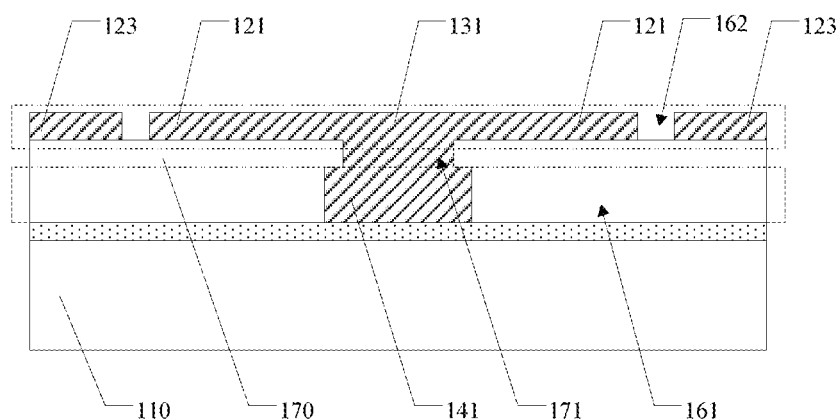
FIG. 3 is a cross-sectional view illustrating a substrate for light-emitting diode provided by an embodiment of the present disclosure taken along A-A direction of FIG. 2A.

FIG. 3 is a cross-sectional view illustrating a substrate for light-emitting diode provided by an embodiment of the present disclosure taken along A-A direction of FIG. 2A. As illustrated in FIG. 3, a anode wire 141 and a cathode wire 142 (not illustrated in FIG. 3) are located at a same layer on a base substrate 110, e.g., a first layer 161 as illustrated in FIG. 3; an anode electrode pad 121, a cathode electrode pad 122, a series electrode pad 123, a first parallel-connection line 131, a second parallel-connection line 132 and a series-connection line 133 are located at a same layer on the base substrate 110, e.g., a second layer 162 as illustrated in FIG. 3. The substrate for light-emitting diode further includes a first insulating layer 170 disposed between the first layer 161 and the second layer 162; that is to say, the first insulating layer 170 is disposed on a side of the anode wire 141 and of the cathode wire 142 away from the base substrate 110; the at least two anode electrode pads 121, the at least two cathode electrode pads 122, the series electrode pad 123, the first parallel-connection line 131, the second parallel-connection line 132 and the series-connection line 133 are located in a same layer and are disposed on a side of the first insulating layer away from the base substrate; the first insulating layer 170 includes a first via hole 171 and a second via hole 172 (not illustrated); the anode wire 141 is electrically connected to the anode electrode pad 121 or the first parallel-connection line 131 through the first via hole 171. Similarly, the cathode wire 142 is electrically connected to the cathode electrode pad 122 or the second parallel-connection line 132 through the second via hole 172. It should be explained that, FIG. 3 is a cross-sectional view taken along A-A direction of FIG. 2A, without sectioning the cathode wire 142 and the second via hole 172. Details of the cathode wire 142 and the second via hole 172 may be referred to that of the anode wire 131 and the first via hole 171.

Figure 4:
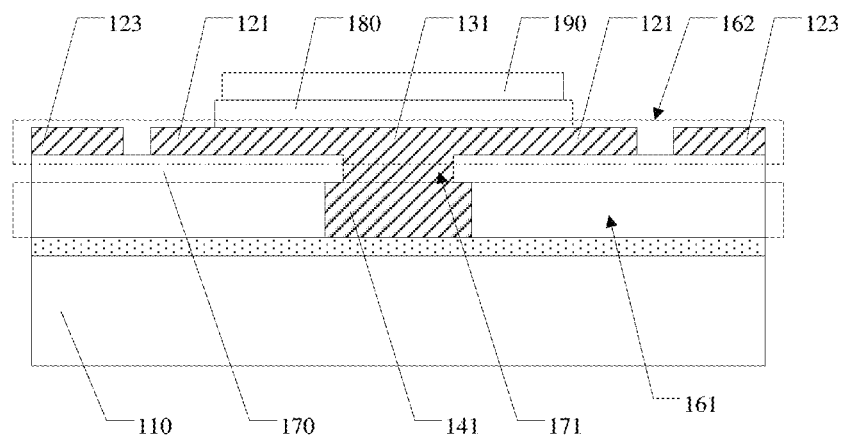
FIG. 4 is a side view illustrating a substrate for light-emitting diode provided by an embodiment of the present disclosure.

FIG. 4 is a side view illustrating a substrate for light-emitting diode provided by an embodiment of the present disclosure. As illustrated in FIG. 4, the substrate for light-emitting diode further includes a second insulating layer 180 disposed on a side of the second layer 162 away from the base substrate 110, and a reflecting layer 190 disposed on a side of the second insulating layer 180 away from the base substrate 110. The reflecting layer 190 can be configured to reflect light emitted from the light-emitting diode so as to improve a brightness of the substrate for light-emitting diode.

Generally, the reflecting layer 190 can be formed by using an organic white oil material. However, the organic white oil material has poor property of high temperature resistance. Therefore, in some examples, the material of the reflecting layer 190 can include silver (Ag) to improve the property of high temperature resistance of the reflecting layer, so that the reflecting layer 190 still maintains a relatively higher reflectivity under high temperature condition or after a certain time of usage.

For example, in some examples, the reflecting layer 190 can further include an oxidation-resistant layer (e.g., TIO) disposed on both of an upper side and a lower side of Ag; that is to say, the reflecting layer 190 can have a stacked structure of ITO/Ag/TIO.

Figure 5:
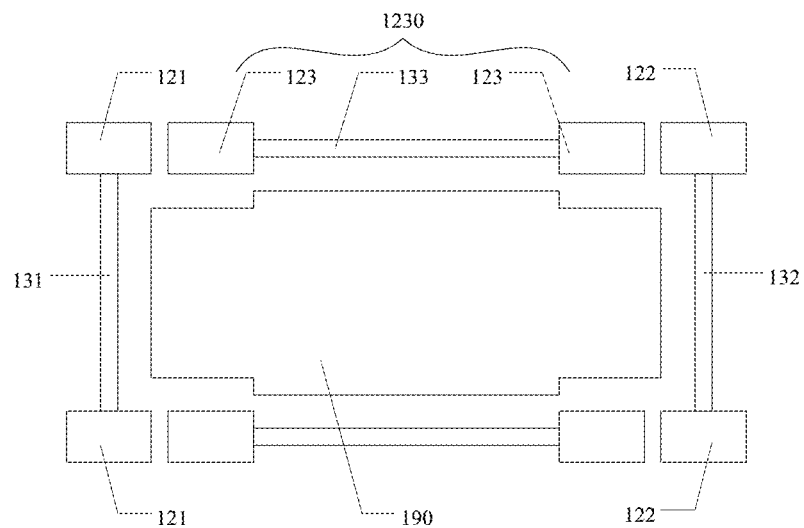
FIG. 5 is a top view illustrating a light-emitting sub-region in a substrate for light-emitting diode provided by an embodiment of the present disclosure.
Figure 6:
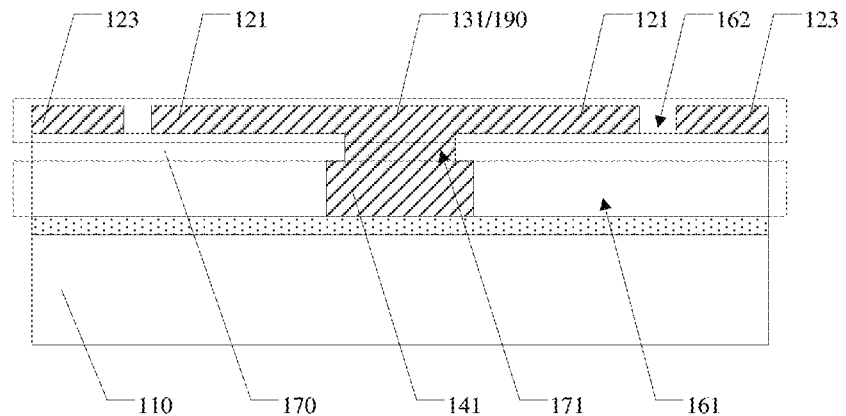
FIG. 6 is a side view illustrating another substrate for light-emitting diode provided by an embodiment of the present disclosure.

For example, in some examples, the reflecting layer 190 can be disposed at the second layer 162. FIG. 5 is a top view illustrating a light-emitting sub-region in a substrate for light-emitting diode provided by an embodiment of the present disclosure. FIG. 6 is a side view illustrating another substrate for light-emitting diode provided by an embodiment of the present disclosure. As illustrated in FIG. 5 and FIG. 6, the second layer 162 further includes a reflecting layer 190, and the reflecting layer 190 is located within a region delimited by the first parallel-connection line 131, the second parallel-connection line 132 and the series-connection line 133. As illustrated in FIG. 5, because an orthographic projection of the reflecting layer 190 on the base substrate 110 is not overlapped with the orthographic projections of the first parallel-connection line 131, the second parallel-connection line 132 and the series-connection line 133 on the base substrate 110, the second layer 162 and the reflecting layer 190 can be formed by using a same metallic layer. In such case, in order to ensure a reflective property of the reflecting layer 190, a material of the anode electrode pad, the cathode electrode pad, the first parallel-connection line, the second parallel-connection line and the series-connection line can be as same as that of the reflecting layer 190, for example, the above-mentioned stacked structure of ITO/Ag/ITO can be adopted. In this way, the substrate for light-emitting diode provided by the present embodiment arranges the reflecting layer and the second layer at a same layer, so as to further decrease the thickness of the substrate for light-emitting diode, reduce the time of Mask process in the manufacturing method, and hence to lower the manufacture cost. Furthermore, because the stacked structure of ITO/Ag/ITO still can maintain a good reflective property and possess a higher conductivity even under high temperature conditions, the substrate for light-emitting diode can provide better electrical property and reflectivity while decreasing the thickness.

For example, in some examples, a material of the anode wire or the cathode wire can include copper (Cu). Cu has good conductive property, and hence can be applied in a large-sized substrate for light-emitting diode.

For example, in some examples, a thickness of the anode wire and/or the cathode wire is greater than or equal to a thickness of the first parallel-connection line and/or second parallel-connection line. Upon comprehensively considering the current, the resistance and the technology difficulty, setting the thickness of the anode wire and/or the cathode wire to be greater than or equal to the thickness of the first parallel-connection line and/or second parallel-connection line can achieve better performance and reduced technology difficulty.

For example, in some examples, the thickness of the anode wire and/or the cathode wire is greater than or equal to 5.2 μm. In the case where the substrate for light-emitting diode provided by the present embodiment is applied in a large-sized display device, because the light-emitting diode needs to be driven by current, a current on the anode wire or the cathode wire during an operation of the large-sized substrate for light-emitting diode is relatively larger; as a result, it needs to form the anode wire or the cathode wire to have larger thickness (the thickness is a size in a direction perpendicular to the base substrate). For example, when Cu is selected to form the above-mentioned anode wire and cathode wire, in order to ensure excellent display effect, a magnitude of current on the anode wire and the cathode wire in a substrate for light-emitting diode corresponding to a 65-inch liquid crystal display device is 8.7 mA. In order to satisfy such requirement for large current and also to control a temperature rising influence during the operation, when an equal-line-width solution (i.e., the anode wire and the cathode wire on the substrate for light-emitting diode have a same line width) is adopted, the thickness of the anode wire and the cathode wire has to be greater than 5.2 μm. That is to say, it has to form a Cu layer with a thickness greater than 5.2 μm.

Figure 7:
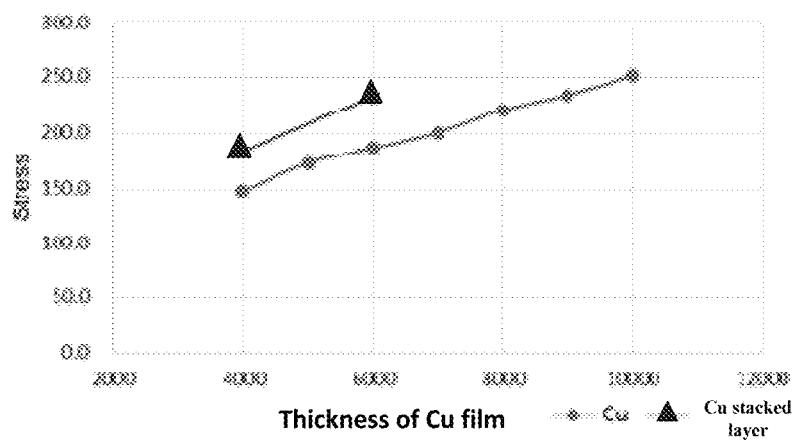
FIG. 7 is a curve graph illustrating a stress in a copper layer which is changed with a thickness of the copper layer.
Figure 8:
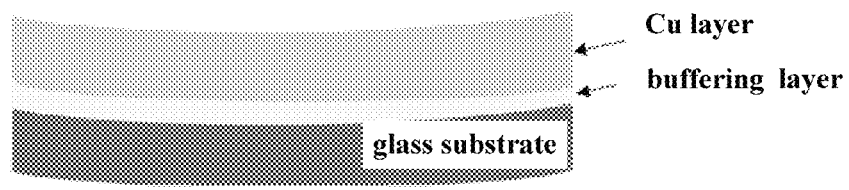
FIG. 8 is a schematic diagram illustrating a stress in a copper layer which causes a substrate to be curved.

FIG. 7 is a curve graph illustrating a stress in a Cu layer which is changed with a thickness of the Cu layer. As illustrated in FIG. 7, a stress in a Cu layer with a thickness of 10000 Å is about 1.7 times of a stress in a Cu layer with a thickness of 4000 Å, thus the stress of the Cu layer is linearly increased with an increase of the thickness thereof. When the Cu layer has large stress, it's liable to result in the defects that the base substrate is curved or broken, as illustrated in FIG. 8. Therefore, the thickness of the Cu layer should not be increased infinitely.

Figure 9:
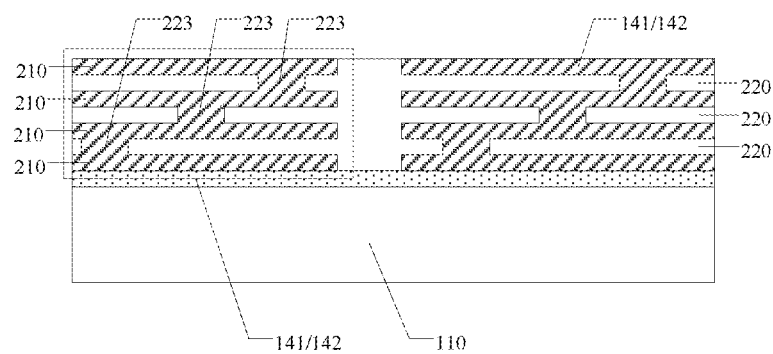
FIG. 9 is a cross-sectional view illustrating an anode wire or a cathode wire in a substrate for light-emitting diode provided by an embodiment of the present disclosure.

FIG. 9 is a cross-sectional view illustrating an anode wire or a cathode wire in a substrate for light-emitting diode provided by an embodiment of the present disclosure. As illustrated in FIG. 9, at least one of the anode wire 141 and the cathode wire 142 includes: at least two metallic sub-layers 210 stacked in a direction perpendicular to the base substrate 110, for example, the metallic sub-layer 210 can be a Cu sub-layer 210; and an interlayered insulating layer 220 disposed between adjacent two Cu sub-layers 210. The interlayered insulating layer 220 includes a third via hole 223, and the Cu sub-layers 210 disposed at both sides of the interlayered insulating layer 220 are electrically connected through the third via hole 223. In the existing technology, because a Cu layer formed in a single process has a maximum thickness smaller than 3 μm, at least one of the anode wire 141 and the cathode wire 142 can be formed in a layer-by-layer manner by dividing at least one of the anode wire 141 and the cathode wire 142 into at least two Cu sub-layers 210 and by ensuring an electric connection through the third via hole 223 in the interlayered insulating layer 220, so as to achieve forming the anode wire 141 and/or the cathode wire 142 at a larger thickness. Additionally, dividing the anode wire 141 and/or the cathode wire 142 having a large thickness into at least two Cu sub-layers 210 and arranging the interlayered insulating layer 220 between two adjacent Cu sub-layers 210 can well eliminate a stress between the two adjacent Cu sub-layers 210, so as to avoid the defects of large stress and curved base substrate which are resulted by large thickness of the anode wire 141 and/or the cathode wire 142. Of course, the present disclosure includes such case but is not limited thereto, and the above-mentioned metallic sub-layer can be a film layer of other metallic materials.

For example, the above-mentioned Cu sub-layer 210 can be formed by using a sputtering process.

For example, in some examples, a material of the interlayered insulating layer 220 can include an organic material.

For example, in some examples, as illustrated in FIG. 9, at least one of the anode wire 141 and the cathode wire 142 includes at least two interlayered insulating layers 220; in such case, at least one of the anode wire 141 and the cathode wire 142 includes at least three Cu sub-layers 210. Orthographic projections of third vias 223 in the at least two interlayered insulating layers 220 on the base substrate 110 are arranged in a staggered manner, so as to eliminate the stress between two adjacent Cu sub-layers 210 in a better way. Moreover, because the orthographic projections of the third vias 223 on the base substrate 110 are arranged in a staggered manner, a level of flatness of the anode wire 141 and/or the cathode wire 142 can be improved.

For example, in some examples, a thickness of the Cu sub-layer 210 is smaller than 3 µm, and a thickness of the interlayered insulating layer 220 is in the range of 1-3 µm.

Figure 10:
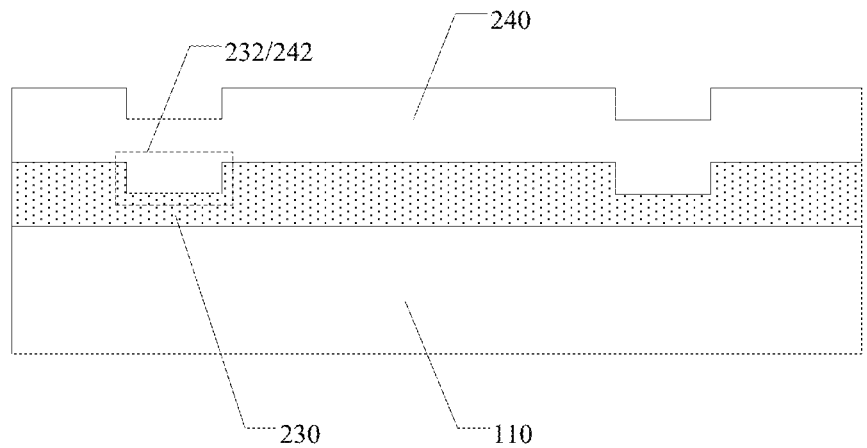
FIG. 10 is a cross-sectional view illustrating an anode wire or a cathode wire in another substrate for light-emitting diode provided by an embodiment of the present disclosure.

FIG. 10 is a cross-sectional view illustrating an anode wire or a cathode wire in another substrate for light-emitting diode provided by an embodiment of the present disclosure. As illustrated in FIG. 10, at least one of the anode wire 141 and the cathode wire 142 includes; a stress buffering layer 230 and a Cu layer 240 disposed on a side of the stress buffering layer 230 away from the base substrate 110; a material of the stress buffering layer 230 includes a material which generates a compressive stress.

Figure 11:
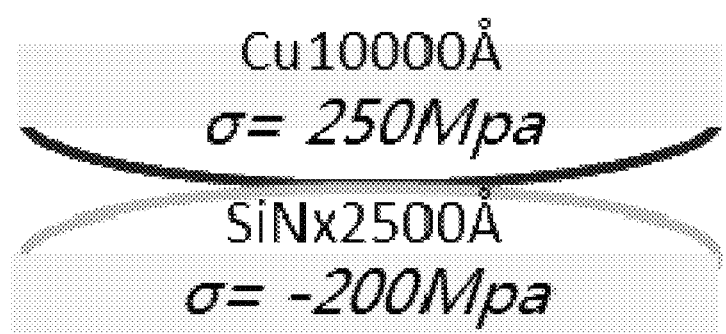
FIG. 11 is a schematic diagram illustrating a stress relief of an anode wire or a cathode wire in a substrate for light-emitting diode provided by an embodiment of the present disclosure.

FIG. 11 is a schematic diagram illustrating a stress relief of an anode wire or a cathode wire in a substrate for light-emitting diode provided by an embodiment of the present disclosure. As illustrated in FIG. 11, a stress generated by the Cu layer 240 is a tensile stress while a stress generated by the stress buffering layer 230 is a compressive stress. As a result, the stress buffering layer 230 can effectively eliminate the stress generated by the Cu layer 240.

For example, when a thickness of the Cu layer 240 is 10000 Å, the stress buffering layer 230 can adopt silicon nitride (SiNx) with a thickness of 2500 Å. A stress generated by a Cu layer 240 with a thickness of 10000 Å is 250 Mpa, while a stress generated by the stress buffering layer 230 is −200 Mpa; after the stress of the Cu layer 240 is counteracted with the stress of the stress buffering layer 230, the remaining stress will be 50 Mpa in total.

For example, in some examples, as illustrated in FIG. 10, the stress buffering layer 230 includes a recess 232 which is concaved from a surface of the stress buffering layer 230 away from the base substrate 110 towards the base substrate 110; the Cu layer 240 includes a filling portion 242 filled within the recess 232. In this way, a stress of a Cu layer 240 with a large thickness can be blocked, so as to avoid the defects of large stress and curved base substrate which are resulted by large thickness of the anode wire 141 and/or the cathode wire 142.

For example, in some examples, a material of the stress buffering layer 230 can include silicon nitride (SiNx).

Figure 12:
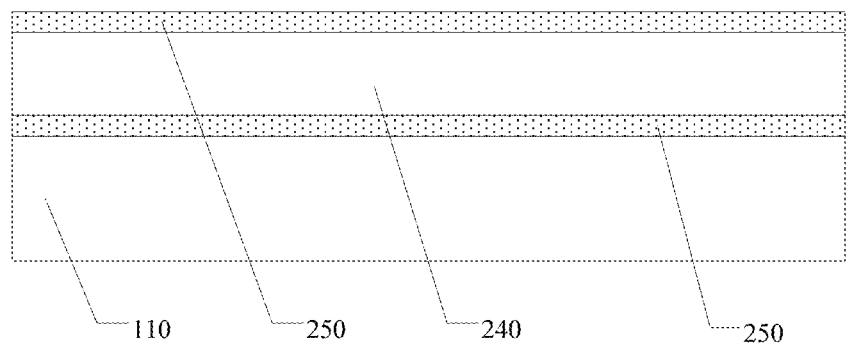
FIG. 12 is a cross-sectional view illustrating an anode wire or a cathode wire in another substrate for light-emitting diode provided by an embodiment of the present disclosure.

FIG. 12 is a cross-sectional view illustrating an anode wire or a cathode wire in another substrate for light-emitting diode provided by an embodiment of the present disclosure. As illustrated in FIG. 12, at least one of the anode wire 141 and the cathode wire 142 includes: a Cu layer 240 and Mo—Nb alloy (MoNb) layers 250 disposed at both sides of the Cu layer 240. On one hand, the Mo—Nb alloy (MoNb) layer 250 can increase an adhesive power between the Cu layer 240 and other layer(s); and on the other hand, the Mo—Nb alloy (MoNb) layer 250 can effectively prevent the Cu layer 240 from being oxygenized.

Figure 13:
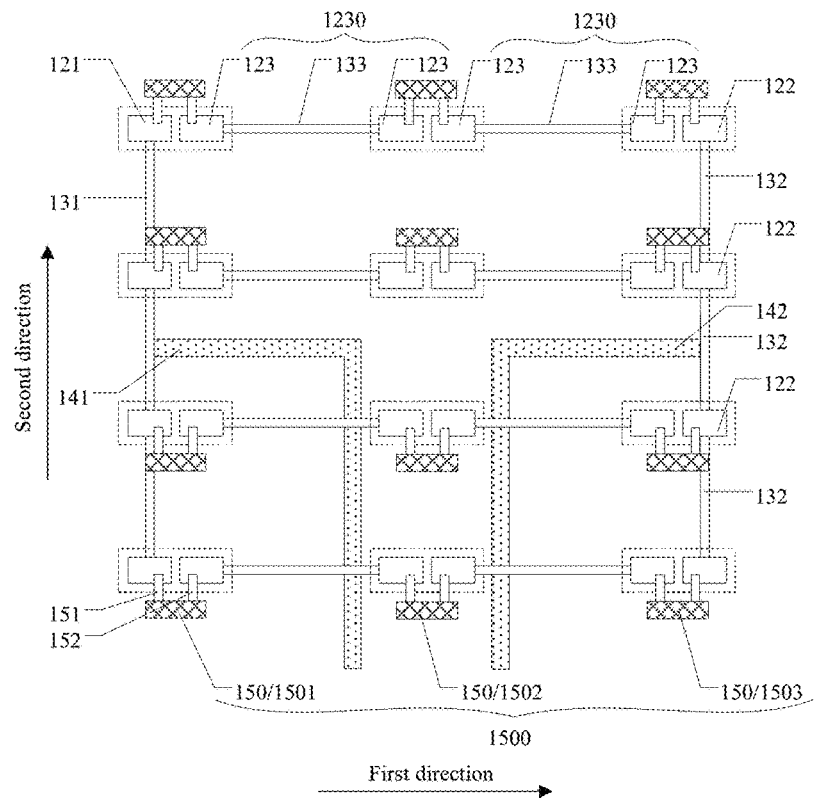
FIG. 13 is a schematic diagram illustrating a light-emitting sub-region in another substrate for light-emitting diode provided by an embodiment of the present disclosure.

Another embodiment of the present disclosure provides a backlight module. FIG. 13 is a schematic diagram illustrating a light-emitting sub-region in a substrate for light-emitting diode provided by an embodiment of the present disclosure. As illustrated in FIG. 13, in the light-emitting sub-region 120, an anode wire 141 is electrically connected with four anode electrode pads 121, and each of the four anode electrode pads 121 electrically connected with the anode wire 141 can be connected with an anode 151 of one light-emitting diode chip 150 (e.g., a first light-emitting diode chip 1501); a cathode wire 142 is electrically connected with four cathode electrode pads 122, and each of the four cathode electrode pads 122 electrically connected with the cathode wire 142 can be connected with a cathode 152 of another light-emitting diode chip 150 (e.g., a third light-emitting diode chip 1503). The light-emitting sub-region 120 includes two series electrode pad groups 1230 disposed between an anode electrode pad 121 and a cathode electrode pad 122 corresponding to each other. In the two series electrode pad groups 1230 disposed between an anode electrode pad 121 and a cathode electrode pad 122 corresponding to each other, the series electrode pad 123 closer to the anode electrode pad 121 in the series-connection electrode pad group 1230 (the series-connection electrode pad group located at the left side) closer to the anode electrode pad 121 can serve as the cathode 152 of the first light-emitting diode chip 1501, and the series electrode pad 123 closer to the cathode electrode pad 122 in the series-connection electrode pad group 1230 (the series-connection electrode pad group located at the left side) closer to the anode electrode pad 121 can serve as the anode 151 of the second light-emitting diode chip 1502; the series electrode pad 123 closer to the anode electrode pad 121 in the series-connection electrode pad group 1230 (the series-connection electrode pad group located at the right side) closer to the cathode electrode pad 122 can serve as the cathode 152 of the second light-emitting diode chip 1502, and the series electrode pad 123 closer to the cathode electrode pad 122 in the series-connection electrode pad group 1230 (the series-connection electrode pad group located at the right side) closer to the cathode electrode pad 122 can serve as the anode 151 of the third light-emitting diode chip 1503. In this way, the first light-emitting diode chip 1501, the second light-emitting diode chip 1502 and the third light-emitting diode chip 1503 are connected in series between the anode electrode 121 and the cathode electrode pad 122 which are corresponding to each other. In such case, because four anode electrode pads 121 are electrically connected through the first parallel-connection line 131 and because four cathode electrode pads 122 are electrically connected through the second parallel-connection line 132, the first parallel-connection line 131 and the second parallel-connection line 132 can connect four groups of first light-emitting diode chips 1501, second light-emitting diode chips 1502 and third light-emitting diode chips 1503 corresponding to the four anode electrode pads 121 and the four cathode electrode pads 122, "in parallel", so as to constitute a "3-series 4-parallel" structure. In such case, the light-emitting sub-region 120 in FIG. 13 can include and simultaneously drive twelve light-emitting diode chips. It should be explained that, the dashed boxes in FIG. 13 can indicate electrode pads (anode electrode pad, cathode electrode pad or series electrode pad) connected with the anode and the cathode of a same light-emitting diode. The terms "first", "second" and "third" in the above-mentioned "first light-emitting diode chip", "second light-emitting diode chip" and "third light-emitting diode chip" are for the purpose of more clear description, without constituting any limitation to the structure of the light-emitting diode per se. Moreover, a portion of the anode wire 141 or the cathode wire 142 intersected with the series-connection line 133 in FIG. 13 is not electrically connected with the series-connection line 133, and can be insulated from the series-connection line 133 through an insulating layer disposed there-between.

Figure 14:
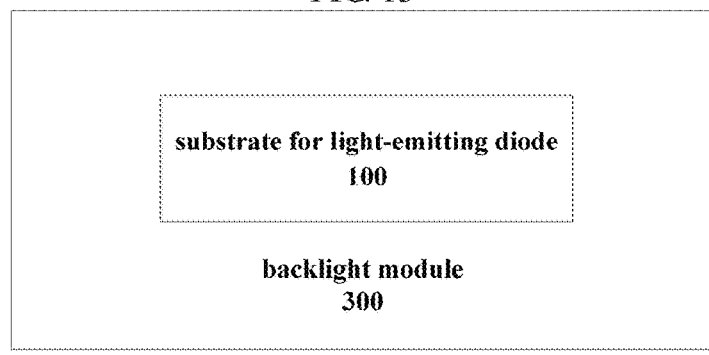
FIG. 14 is a schematic diagram illustrating a backlight module provided by an embodiment of the present disclosure.

An embodiment of the present disclosure provides a backlight module. FIG. 14 is a schematic diagram illustrating a backlight module provided by an embodiment of the present disclosure. As illustrated in FIG. 14, the backlight module 300 includes the substrate for light-emitting diode 100 provided by any of the above-described embodiments or examples. Because the driving circuit of the light-emitting diode in the substrate for light-emitting diode is formed on the base substrate, it can decrease the thickness of the substrate for light-emitting diode and reduce the manufacture cost. As a result, the backlight module provided by the present embodiment has a smaller thickness and a reduced manufacture cost. Moreover, by means of a plurality of light-emitting sub-regions having the above-described "N-series N parallel" structure, the substrate for light-emitting diode can achieve driving a plurality of light-emitting diode chips to emit light in a single light-emitting sub-region and individually driving each of the light-emitting sub-regions. Therefore, the backlight module provided by the present embodiment, on one hand, can reduce the number of wire in the driving circuit of the light-emitting diode chip by driving a plurality of light-emitting diode chips to emit light in a single light-emitting sub-region so as to have a relatively larger size, and on the other hand can increase a luminance different between different light-emitting sub-regions by individually driving each of the light-emitting sub-regions so as to have a relatively higher contrast ratio.

Figure 15:
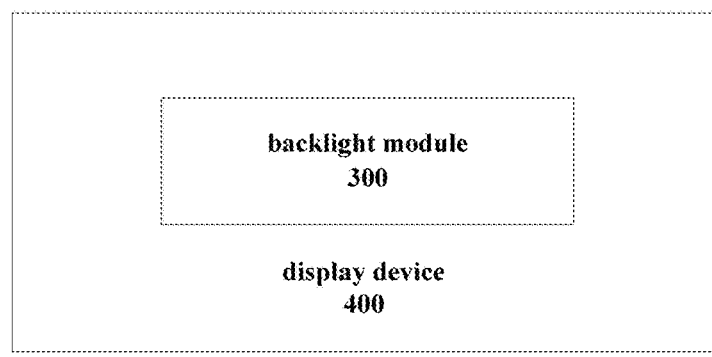
FIG. 15 is a schematic diagram illustrating a display device provided by an embodiment of the present disclosure.

An embodiment of the present disclosure provides a display device. FIG. 15 is a schematic diagram illustrating a display device provided by an embodiment of the present disclosure. As illustrated in FIG. 15, the display device 400 includes a liquid crystal display panel 410 and a backlight module 300. The backlight module 300 can be the one provided by any of the above-described embodiments or examples. In this way, the display device can have smaller thickness and larger volume, as well as higher contrast ratio, so as to provide better display effect.

An embodiment of the present disclosure provides a manufacturing method of a substrate for light-emitting diode. FIG. 16 is a flow chart illustrating a manufacturing method of a substrate for light-emitting diode provided by an embodiment of the present disclosure. As illustrated in FIG. 16, the manufacturing method of the substrate for light-emitting diode includes steps S201-S205 as below.

Step S201: defining a plurality of light-emitting sub-regions on a base substrate, and forming an anode wire and a cathode wire in each of the plurality of light-emitting sub-regions.

Step S202: in each of the plurality of light-emitting sub-regions, forming at least two anode electrode pads and a first parallel-connection line which are electrically connected with the anode wire, and forming at least two cathode electrode pads and a second parallel-connection line which are electrically connected with the cathode wire. A plane of the base substrate includes a first direction and a second direction perpendicular to the first direction; the at least two anode electrode pads are arranged along the second direction and are electrically connected through the first parallel-connection line; the at least two cathode electrode pads are arranged along the second direction and are electrically connected through the second parallel-connection line; and the at least two cathode electrode pads are disposed in one-to-one correspondence with the at least two anode electrode pads.

Step S203: forming at least one series-connection electrode pad group arranged along the first direction between the anode electrode pad and the cathode electrode pad corresponding to each other. Each of the at least one series-connection electrode pad group includes two series electrode pads electrically connected through a series-connection line.

The manufacturing method of the substrate for light-emitting diode provided by the present embodiment forms the driving circuit of the light-emitting diode chip on the base substrate, so as to decrease the thickness of the substrate for light-emitting diode and lower the manufacture cost. Moreover, by forming at least one series-connection electrode pad group arranged along the first direction between the anode electrode pad and the cathode electrode pad corresponding to each other and by including two series electrode pads electrically connected through a series-connection line in each of the at least one series electrode pad group, the manufacturing method of the substrate for light-emitting diode provided by the present embodiment allows at least two light-emitting diode chips connected to at least two anode electrode pads to be connected "in parallel", allows at least two light-emitting diode chips connected to at least two cathode electrode pads to be connected "in parallel", and allows at least two light-emitting diode chips arranged along the first direction to be connected "in series", so as to constitute a "N-series N-parallel" (N is greater than or equal to 2) structure. In this way, a substrate for light-emitting diode as manufactured by the manufacturing method of the substrate for light-emitting diode provided by the present embodiment on one hand can reduce the number of wire in the driving circuit of the light-emitting diode chip by driving a plurality of light-emitting diode chips to emit light in a single light-emitting sub-region so as to provide a large-sized substrate for light-emitting diode, and on the other hand can increase a luminance different between different light-emitting sub-regions by individually driving each of the light-emitting sub-regions so as to provide a higher contrast ratio FIG. 17A-FIG. 17F are schematic diagrams illustrating various steps of a manufacturing method of a substrate for light-emitting diode provided by an embodiment of the present disclosure. As illustrated in FIG. 17A-FIG. 17F, the manufacturing method of the substrate for light-emitting diode can include the following.

As illustrated in FIG. 17A, forming a stress buffering layer 230 on a base substrate 110. For example, the stress buffering layer 230 can adopt a material which can generate a compressive stress, for example, silicon nitride ($SiN_x$).

For example, a thickness of the stress buffering layer 230 can be in the range of 1000 Å-5000 Å.

As illustrated in FIG. 17B, forming a first layer 161 at a side of the stress buffering layer 230 away from the base substrate 110. The first layer 161 can include a Cu layer 240, and Mo—Nb alloy (MoNb) layers 250 disposed at both sides of the Cu layer 240 to increase an adhesive power between the Cu layer 240 and other film layer(s) at an upper side and a lower side of the Cu layer 240. The Cu layer 240 and the Mo—Nb alloy (MoNb) layers 250 are configured to form the anode wire 141 and the cathode wire 142. Particular structures of the stress buffering layer 230 and the first layer 161 may be referred to FIG. 10.

For example, a thickness of the Cu layer 240 in the first layer 161 is greater than or equal to 5.2 µm; and a thickness of the Mo—Nb alloy (MoNb) layer 250 in the first layer 161 is in the range of 100 Å-500 Å.

Figure 17C:
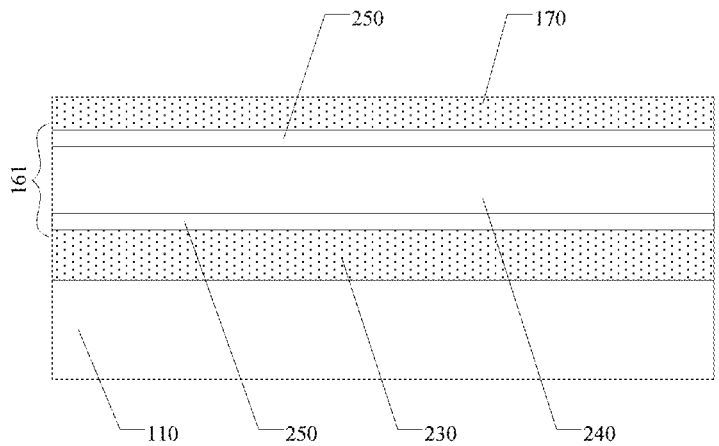

As illustrated in FIG. 17C, forming a first insulating layer 170 at a side of the Cu layer 240 and the Mo—Nb alloy (MoNb) layer 250 away from the base substrate 110. The first insulating layer 170 can include a single-layered structure or a multi-layered structure of at least one of silicon nitride, silicon oxide and silicon oxynitride.

For example, a thickness of the first insulating layer 170 is in the range of 1000 Å-10000 Å.

Figure 17D:
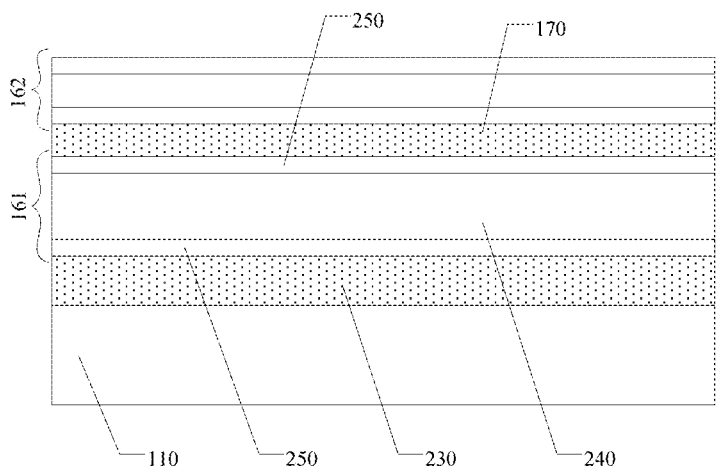

As illustrated in FIG. 17D, forming a second layer 162 at a side of the first insulating layer 170 away from the base substrate 110. The second layer 162 can also include a Cu layer and Mo—Nb alloy (MoNb) layers 250 disposed at both sides of the Cu layer; and a thickness of the second layer 162 is smaller than that of the first layer 161.

For example, a thickness of the Cu layer in the second layer 162 is in the range of 2000 Å-6000 Å, and a thickness of the Mo—Nb alloy (MoNb) layer in the second layer 162 is in the range of 100 Å-500 Å.

Figure 17E:
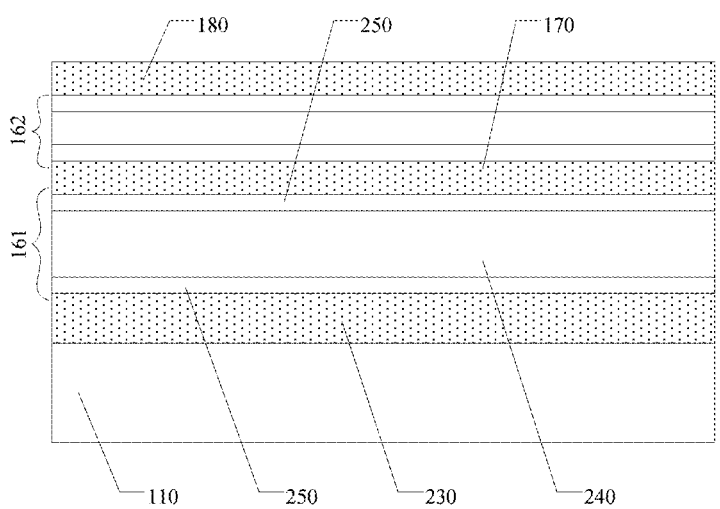

As illustrated in FIG. 17E, forming a second insulating layer 180 at a side of the second layer 162 away from the base substrate 110.

Figure 17F:
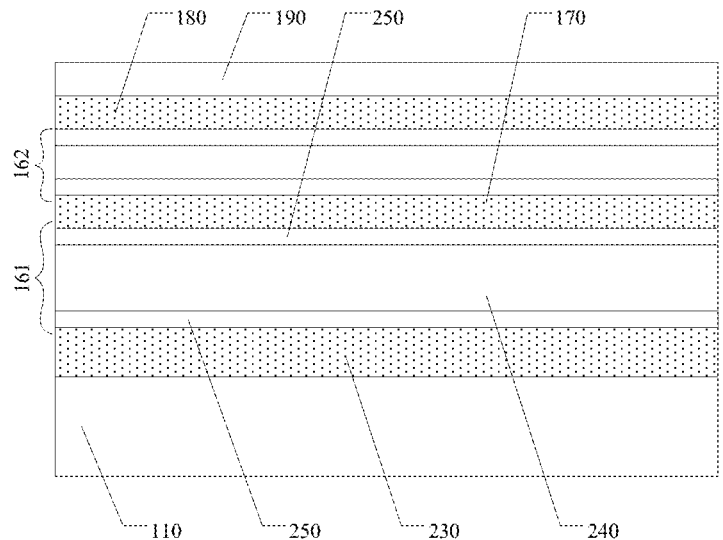

As illustrated in FIG. 17F, forming a reflecting layer 190 at a side of the second insulating layer 180 away from the base substrate 110. The reflecting layer 190 can be formed by using an organic white oil material. However, the organic white oil material has poor property of high temperature resistance. As a result, in some examples, the material of the reflecting layer 190 can include Ag to improve the property of high temperature resistance of the reflecting layer 190, so that the reflecting layer 190 still maintains a relatively higher reflectivity after a certain time of usage.

For example, in some examples, the reflecting layer 190 can further include an oxidation-resistant layer (e.g., indium tin oxide (TIO)) disposed on both of an upper side and a lower side of Ag; that is to say, the reflecting layer 190 can include a stacked structure of ITO/Ag/TIO.

For example, in some examples, in order to prevent the anode electrode pad, the cathode electrode pad and the series electrode pad from being oxygenized during being welded with the anode or cathode of the light-emitting diode, an oxidation-resistant conductive layer, for example, an ITO layer can be formed on the anode electrode pad, the cathode electrode pad and the series electrode pad.

For example, in some examples, the reflecting layer can be formed in a same layer with the second layer; that is to say, the second layer and the reflecting layer can be made from a same material, for example, by adopting the above-mentioned stacked structure of ITO/Ag/ITO, so as to further decrease the thickness of the substrate for light-emitting diode and reduce the number of Mask process of the manufacturing method, thereby lowering the manufacture cost.

Figure 18:
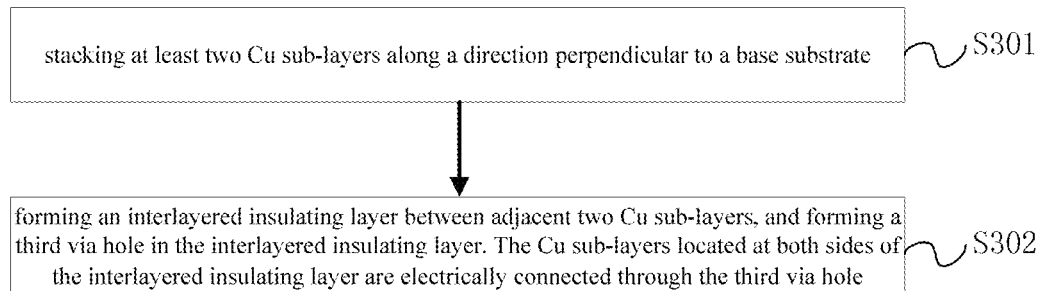
FIG. 18 is a flow chart illustrating a manufacturing method of a copper layer provided by an embodiment of the present disclosure.

An embodiment of the present disclosure further provides a manufacturing method of a Cu layer. FIG. 18 is a flow chart illustrating a manufacturing method of a Cu layer provided by an embodiment of the present disclosure. As illustrated in FIG. 18, the manufacturing method includes:

Step S301: stacking at least two Cu sub-layers along a direction perpendicular to a base substrate; and Step S302: forming an interlayered insulating layer between adjacent two Cu sub-layers, and forming a third via hole in the interlayered insulating layer. The Cu sub-layers located at both sides of the interlayered insulating layer are electrically connected through the third via hole.

In the existing technology, a Cu layer formed in a single process has a maximum thickness smaller than 3 µm, thus by dividing the Cu layer into at least two Cu sub-layers to be formed, a Cu layer having a relatively larger thickness can be obtained. Moreover, by dividing the Cu layer having a relatively larger thickness into at least two Cu sub-layers and by arranging an interlayered insulating layer between two adjacent Cu sub-layers, a stress between the two adjacent Cu sub-layers can be well eliminated, so as to avoid the defects of larger stress and curved base substrate which are resulted by the relatively larger thickness of the Cu layer.

For example, the above-mentioned Cu sub-layer can be formed by using a sputtering process.

For example, in some examples, a material of the interlayered insulating layer can include an organic material.

For example, in some examples, the Cu layer includes at least two interlayered insulating layers; in such case, the Cu layer includes at least three Cu sub-layers. Orthographic projections of third vias in the at least two interlayered insulating layers on the base substrate are arranged in a staggered manner so as to eliminate the stress between two adjacent Cu sub-layers in a better way. Moreover, because the orthographic projections of the third vias on the base substrate are arranged in a staggered manner, a level of flatness of the Cu layer can also be improved.

For example, in some examples, a thickness of the Cu sub-layer is smaller than 3 µm, and a thickness of the interlayered insulating layer is in the range of 1-3 µm.

Figure 19:
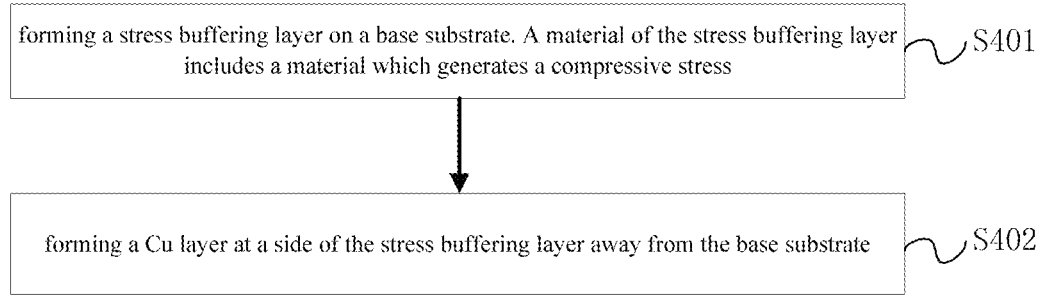
FIG. 19 is a flow chart illustrating another manufacturing method of a copper layer provided by an embodiment of the present disclosure.

An embodiment of the present disclosure further provides another manufacturing method of a Cu layer. FIG. 19 is a flow chart illustrating another manufacturing method of a Cu layer provided by an embodiment of the present disclosure. As illustrated in FIG. 19, the manufacturing method includes the following.

Step S401: forming a stress buffering layer on a base substrate. A material of the stress buffering layer includes a material which generates a compressive stress.

Step S402: forming a Cu layer at a side of the stress buffering layer away from the base substrate.

In the manufacturing method of the Cu layer provided by the present embodiment, the stress generated by the Cu layer is a tensile stress while the stress generated by the stress buffering layer is a compressive stress; as a result, the stress buffering layer can effectively eliminate the stress generated by the Cu layer.

For example, when a thickness of the Cu layer is 10000 Å, the stress buffering layer can adopt silicon nitride (SiNx) with a thickness of 2500 Å. A stress generated by a Cu layer with a thickness of 10000 Å is 250 Mpa, while a stress generated by a stress buffering layer is −200 Mpa; after the stress of the Cu layer is counteracted with the stress of the stress buffering layer, the remaining stress is 50 Mpa in total.

For example, in some examples, the manufacturing method further includes: forming a recess on the stress buffering layer. The recess is concaved from a surface of the stress buffering layer away from the base substrate towards the base substrate. As a result, in a subsequent process of forming a Cu layer, the Cu layer includes a filling portion filled within the recess. In this way, the stress of the Cu layer with a relatively larger thickness can be blocked, so as to avoid the defects of relatively larger stress and curved base substrate which are resulted by the relatively larger stress.

For example, in some examples, a material of the stress buffering layer can include silicon nitride (SiNx).

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

The foregoing are merely specific embodiments of the present disclosure, but not limitative to the protection scope of the present disclosure. Within the technical scope disclosed by the present disclosure, any alternations or replacements which can be readily envisaged by one skilled in the art shall be within the protection scope of the present disclosure. Therefore, the protection scope of the invention shall be defined by the accompanying claims.

What is claimed is:

1. A substrate for light-emitting diode, comprising:
a base substrate; and
a plurality of light-emitting sub-regions on the base substrate, wherein
each of the plurality of light-emitting sub-regions comprises:
at least two anode electrode pads electrically connected through a first parallel-connection line; and
at least two cathode electrode pads electrically connected through a second parallel-connection line;
an anode wire electrically connected with the anode electrode pad;
a cathode wire electrically connected with the cathode electrode pad; and
a first insulating layer on a side of the anode wire and of the cathode wire away from the base substrate,
wherein the at least two cathode electrode pads are in one-to-one correspondence with the at least two anode electrode pads; at least one series-connection electrode pad group is further comprised between the cathode electrode pad and the anode electrode pad which are corresponding to each other; each of the at least one series-connection electrode pad group comprises two series electrode pads which are electrically connected through a series-connection line,
the at least two anode electrode pads, the at least two cathode electrode pads, the series electrode pads, the first parallel-connection line, the second parallel-connection line, and the series-connection line are disposed in a same layer and located on a side of the first insulating layer away from the base substrate,
the first insulating layer comprises a first via hole and a second via hole, the anode wire is electrically connected with the anode electrode pad or the first parallel-connection line through the first via hole, and the cathode wire is electrically connected with the cathode electrode pad or the second parallel-connection line through the second via hole.

2. The substrate for light-emitting diode according to claim 1, further comprising:

a reflecting layer located within a region delimited by the first parallel-connection line, the second parallel-connection line and the series-connection line,
the reflecting layer is located in a same layer with the anode electrode pad, the cathode electrode pad, the first parallel-connection line, the second parallel-connection line and the series-connection line, and is made of a same material with the anode electrode pad, the cathode electrode pad, the first parallel-connection line, the second parallel-connection line and the series-connection line, and
a material of the reflecting layer comprises ITO/Ag/ITO.

3. A substrate for light-emitting diode, comprising:
a base substrate; and
a plurality of light-emitting sub-regions on the base substrate, wherein
each of the plurality of light-emitting sub-regions comprises:
at least two anode electrode pads electrically connected through a first parallel-connection line; and
at least two cathode electrode pads electrically connected through a second parallel-connection line, wherein
the at least two cathode electrode pads are in one-to-one correspondence with the at least two anode electrode pads; at least one series-connection electrode pad group is further comprised between the cathode electrode pad and the anode electrode pad which are corresponding to each other; each of the at least one series-connection electrode pad group comprises two series electrode pads which are electrically connected through a series-connection line,
wherein a thickness of the anode wire or the cathode wire is greater than or equal to a thickness of the first parallel-connection line or a thickness of the second parallel-connection line,
a material of at least one of the anode wire and the cathode wire comprises copper (Cu), at least one of the anode wire and the cathode wire comprises:
at least two metallic sub-layers stacked along a direction perpendicular to the base substrate; and
an interlayered insulating layer between two adjacent ones of the at least two metallic sub-layers,
wherein the interlayered insulating layer comprises a third via hole, and metallic sub-layers located at two sides of the interlayered insulating layer are electrically connected through the third via hole, orthographic projections of third via holes of the at least two interlayered insulating layers on the base substrate are arranged in a staggered manner,
a material of at least one of the anode wire and the cathode wire comprises copper (Cu), the metallic sub-layer is a Cu sub-layer, and
a thickness of the Cu sub-layer is smaller than 3 μm, and a thickness of the interlayered insulating layer is in the range of 1-3 μm.

* * * * *